US007643364B2

(12) United States Patent  (10) Patent No.: US 7,643,364 B2
Lee et al. (45) Date of Patent: Jan. 5, 2010

(54) SEMICONDUCTOR MEMORY DEVICE

(75) Inventors: Jong-Cheol Lee, Seoul (KR); Myeong-O Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 182 days.

(21) Appl. No.: 12/004,291

(22) Filed: Dec. 20, 2007

(65) Prior Publication Data

US 2008/0159037 A1   Jul. 3, 2008

(30) Foreign Application Priority Data

Jan. 3, 2007   (KR) ...................... 10-2007-0000566

(51) Int. Cl.
*G11C 7/00* (2006.01)
(52) U.S. Cl. ........................ 365/207; 365/194; 365/203; 365/189.05; 365/233
(58) Field of Classification Search ................. 365/207, 365/189.05, 203, 194, 233
See application file for complete search history.

(56) References Cited

U.S. PATENT DOCUMENTS

| 5,404,338 | A | * | 4/1995 | Murai et al. ........... 365/189.05 |
| 6,144,230 | A | | 11/2000 | Kim |
| 6,777,986 | B2 | * | 8/2004 | Hidaka et al. ................ 327/108 |
| 6,975,147 | B2 | * | 12/2005 | Hidaka et al. ................ 327/108 |
| 2005/0068833 | A1 | | 3/2005 | Choi |

FOREIGN PATENT DOCUMENTS

| JP | 2006-59530 A | 3/2006 |
| KR | 100164357 B1 | 9/1998 |
| KR | 100335397 B1 | 4/2002 |
| KR | 2003-0017133 A | 3/2003 |
| KR | 2003-0049187 A | 6/2003 |
| KR | 10-2004-0092743 | 11/2004 |
| KR | 10-2005-0031678 A | 4/2005 |

* cited by examiner

*Primary Examiner*—Son Dinh
(74) *Attorney, Agent, or Firm*—Mills & Onello, LLP

(57) ABSTRACT

A semiconductor memory device including a bit line sense amplifier for amplifying a voltage corresponding to a charge stored in a capacitor of a memory cell and outputting an amplified voltage and an I/O sense amplifier for receiving the output of the bit line sense amplifier, amplifying a voltage level of the output and outputting an amplified voltage level is disclosed. The semiconductor memory device includes a sense amplification enable signal control portion which receives an initial sense amplification enable signal, sequentially delays the initial sense amplification enable signal by a plurality of predetermined time periods and selectively outputs a plurality of delayed sense amplification enable signals in view of both an operation speed and a manufacturing yield of a semiconductor memory device; a plurality of clocked sense amplifiers which each receive an output signal of the I/O sense amplifier, amplify the output signal of the I/O sense amplifier in response to each of the plurality of delayed sense amplification enable signals, and sequentially output an output signal of a power voltage level or a ground voltage level in response; and a previous-step output driving circuit which sequentially receives the output signals of the plurality of clocked sense amplifiers, delays the output signals of the plurality of clocked sense amplifiers by a predetermined time period, and then intercepts an output of the clocked sense amplifier of a previous step.

17 Claims, 9 Drawing Sheets

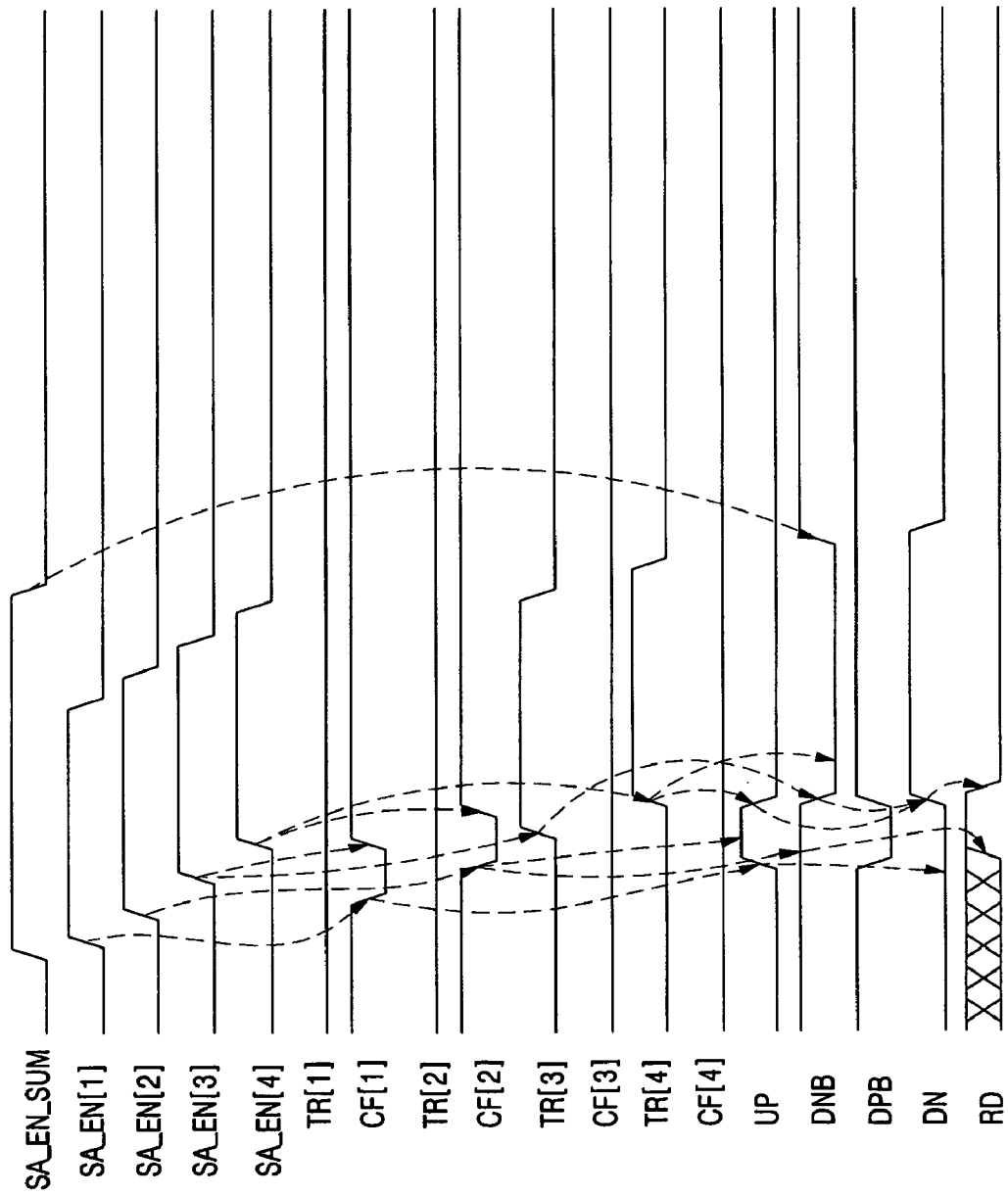

SEMICONDUCTOR MEMORY DEVICE

CROSS-REFERENCE TO RELATED APPLICATION

This application claims the benefit of Korean Patent Application No. 10-2007-0000566, filed Jan. 3, 2007, the disclosure of which is hereby incorporated herein by reference in its entirety.

BACKGROUND OF THE INVENTION

1. Field of the Invention

Embodiments of the present invention relate to a semiconductor memory device, and more particularly, to a semiconductor memory device having a plurality of sense amplifiers which output a plurality of sense amplification enable signals.

2. Description of the Related Art

A semiconductor memory device uses a sense amplifier which receives a small signal to determine a voltage or current level and transmits it to an output pin in order to read data stored in a memory cell.

A sense amplifier having one terminal or a plurality of terminals is conditionally used to properly detect read data stored in a memory cell, and in most cases, the final output terminal of the sense amplifier uses a clocked regenerative amplifier using a positive feedback characteristic since the final output of the sense amplifier should have a power voltage or ground voltage level.

The clocked regenerative amplifier has an advantage in a self amplifying function in that an output signal of a power voltage level and a ground voltage level can be generated in a relatively short time when an enable signal transitions to a high level even in a case where an input signal of a relatively small voltage level is applied.

On the other hand, the clocked regenerative amplifier has a disadvantage in that if error data are applied at a point in time when an enable signal transitions to a high level, a full latch form cannot change them properly them to accurate data, and a semi latch form can possibly change them to accurate data, but it can take a long time for this transition to accurate data.

For the foregoing reasons, the clocked regenerative amplifier can be used in contemporary semiconductor memory devices as a sense amplifier, since a high manufacturing yield can be achieved to ensure that a sense amplification enable period maintains a sufficient margin until a stable input signal is guaranteed.

However, if the sense amplification enable time point is too late, an operation speed characteristic of the semiconductor memory device may be degraded, and thus a sense amplification enable time point should be determined in light of the tradeoff between manufacturing yield and operation speed characteristic.

FIG. 1 is a block diagram illustrating a data output path of a conventional semiconductor memory device having a clocked regenerative amplifier. The semiconductor memory vice of FIG. 1 comprises a memory cell 10, a bit line sense amplifier 20, an I/O sense amplifier 30, a clocked regenerative amplifier 40, a previous-step output driving circuit 50, and an output driving circuit 60. The I/O sense amplifier 30 comprises a current amplifier 32 and a differential amplifier 34.

Functions of the components of the data output path of the semiconductor memory device of FIG. 1 are described below with reference to FIG. 1.

The memory cell 10 receives a row address to enable a word line WL, and the bit line sense amplifier 20 amplifies a voltage corresponding to a charge stored in a capacitor C of the memory cell 10.

The I/O sense amplifier 30 receives outputs of a bit line BL and a bit line bar BLB of the bit line sense amplifier 20 through a global I/O line pair GIO and GIOB to amplify a current level through the current amplifier 32 and the differential amplifier 34.

The clocked regenerative amplifier 40 receives output signals IN and INB of the I/O sense amplifier which do not have a power voltage level or a ground voltage level from the I/O sense amplifier 30 and outputs output signals Q and QB of a power voltage level and a ground voltage level in response to a state of the sense amplification enable signal SA_EN.

The previous-step output driving circuit 50 receives a positive output signal Q of a power voltage level and a negative output signal QB of a ground voltage level from the clocked regenerative amplifier 40 and delays them by a predetermined time before outputting them through a data line.

The output driving circuit 60 receives an output signal from the previous-step output driving circuit 50 and delays it by a predetermined time period before outputting buffered read data to a data I/O pin.

An operation of the data output path of the semiconductor memory device having the clocked regenerative amplifier according to the conventional art is described below with reference to FIG. 1.

When an NMOS transistor N in the memory cell 100 receives a row address through its gate to enable the word line WL, the NMOS transistor N is turned on, so that charge stored in the capacitor C is transmitted through the NMOS transistor N.

The bit line sense amplifier 20 receives charge stored in the capacitor C of the memory cell 10 in the form of an electric current through the bit line BL and the bit line bar BLB to firstly amplify a voltage corresponding thereto.

The I/O sense amplifier 30 receives voltage outputs of the bit line BL and the bit line bar BLB which are firstly amplified by the bit line sense amplifier 20 through the global I/O line pair GIO and GIOB, and secondly amplifies them at the current amplifier 32 and then thirdly amplifies them at the differential amplifier 34.

The clocked regenerative amplifier 40 receives the thirdly amplified voltage outputs which do not have a power voltage level or a ground voltage level from the I/O sense amplifier 30 and receives the sense amplification enable signal SA_EN through a clock signal input terminal, so that it is synchronized with the sense amplification enable signal SA_EN to output the output signals Q and QB of a power voltage level and a ground voltage level.

That is, the clocked regenerative amplifier 40 as the latch form does not operate when the sense amplification, enable signal SA_EN has a low level, and it receives the voltage outputs IN and INB of the I/O sense amplifier 30 which are thirdly amplified and does not have a power voltage level or a ground voltage level to generate in a short time, and output, the output signals Q and QB of a power voltage level and a ground voltage level by repetitive self amplification while the sense amplification enable signal SA_EN transitions to a high level and then maintains a high level.

The previous-step output driving circuit 50 receives the positive output signals and the negative output signals Q and QB which have a power voltage level and a ground voltage level from the clocked regenerative amplifier 40 and delaying them by a predetermined time before outputting them through the data line, and so the output driving circuit 60 receives the output signals and delays them by a predetermined time before outputting the buffered read data RD to the data I/O pin.

FIG. 2 is a dispersion graph illustrating a relationship between a sense amplification enable signal generating time point and a manufacturing yield for the conventional semiconductor memory device. In FIG. 2, a horizontal axis denotes the sense amplification enable signal generating time point, a vertical axis denotes dispersion of semiconductor memory devices manufactured, and the area below the dispersion curve line denotes the manufacturing yield.

An operation speed of the sense amplifier is in proportion to a generation time point of the sense amplification enable signal SA_EN, and thus the faster the generation time point of the sense amplification enable signal SA_EN, the faster the operation speed of the sense amplifier, whereas the slower the generation time point of the sense amplification enable signal SA_EN, the slower the operation speed of the sense amplifier.

The operation speed of the sense amplifier is in inverse proportion to the manufacturing yield, and thus the faster the operation speed of the sense amplifier, the lower the manufacturing yield of the semiconductor memory device, where manufacturing yield can be related to a ratio by which good quality dies are selected in a wafer test process.

Thus, semiconductor memory devices having a relatively fast generating time point of the sense amplification enable signal SA_EN have a relatively low manufacturing yield, whereas semiconductor memory device having a relatively slow generating time point of the sense amplification enable signal SA_EN have a relatively high manufacturing yield, so that a relation therebetween has dispersion of a normal distribution.

For example, assume that one million dies are produced from a semiconductor wafer. In a relatively low-speed semiconductor memory device in which the generating time point of the sense amplification enable signal SA_EN is 4 ns, up to 9 hundred thousand dies are determined to be passed as good quality, whereas in a relatively high-speed semiconductor memory device in which the generating time point of the sense amplification enable signal SA_EN is 3 ns, up to only 8 hundred thousand dies are determined to be passed as good quality.

Such discrepancy in yield can be caused from a mismatch such as an electrical parameter difference and a threshold voltage difference between the NMOS transistors in the sense amplifier and a capacitor difference between the bit line BL and the bit line bar BLB.

In order to resolve this discrepancy, since there is a restriction to setting the optimum generation time point of the sense amplification enable signal SA_EN for all dies on the semiconductor wafer, the low speed semiconductor memory device having a high manufacturing yield is first produced by giving priority to a manufacturing yield or otherwise the high speed semiconductor memory device having a low manufacturing yield is first produced by giving priority to an operation speed. That is, one of the two methods for determining priority should be selected.

SUMMARY OF THE INVENTION

It is an object of the embodiments of the present invention to provide a semiconductor memory device having a plurality of clocked regenerative amplifiers in which a sense amplification enable period maintains a sufficient time margin until a stable input signal is guaranteed in light of a manufacturing yield and also in which sense amplification enable time points are different to prevent an operation speed of the semiconductor memory device from being degraded.

In one aspect, a semiconductor memory device including a bit line sense amplifier for amplifying a voltage corresponding to a charge stored in a capacitor of a memory cell and outputting an amplified voltage at an output and an I/O sense amplifier for receiving the output of the bit line sense amplifier, amplifying a voltage level of the output and outputting an amplified voltage level, comprises: a sense amplification enable signal control portion which receives an initial sense amplification enable signal, sequentially delays the initial sense amplification enable signal by a plurality of predetermined time periods and selectively outputs a plurality of delayed sense amplification enable signals in view of both an operation speed and a manufacturing yield of a semiconductor memory device; a plurality of clocked sense amplifiers which each receive an output signal of the I/O sense amplifier, amplify the output signal of the I/O sense amplifier in response to each of the plurality of delayed sense amplification enable signals, and sequentially output an output signal of a power voltage level or a ground voltage level in response; and a previous-step output driving circuit which sequentially receives the output signals of the plurality of clocked sense amplifiers, delays the output signals of the plurality of clocked sense amplifiers by a predetermined time period, and then intercepts an output of the clocked sense amplifier of a previous step.

The semiconductor memory device can further comprise: a plurality of pre-charge portions which pre-charge both outputs of the plurality of clocked sense amplifiers to the power voltage level in a state that each of the plurality of sense amplification enable signals has a low level and drops one output of the both outputs to the ground voltage level when each of the plurality of sense amplification enable signals transitions to a high level; a plurality of driver input portions which receive the plurality of sense amplification enable signals, a ground voltage signal, and the output signals of the plurality of clocked sense amplifiers and output an output of a corresponding clocked sense amplifier before intercepting an output of a clocked sense amplifier of a two-step prior; and an output driving circuit which receives an output signal of the previous-step output driving circuit, delays the output signal of the previous-step output driving circuit by a predetermined time period and outputs buffered read data.

Each of the plurality of driver input portions can comprise: a NAND gate which receives and NANDs an inverted signal of a sense amplification enable signal of a two-step later or the ground voltage and output signals of a clocked sense amplifier of a one-step later through an input terminal thereof and outputs the NAND result; a first NOR gate which receives and NORs the output signal of the NAND gate and a negative output signal of a corresponding clocked sense amplifier and outputs the NOR result; a second NOR gate which receives and NORs the output signal of the NAND gate and a positive output signal of a corresponding clocked sense amplifier and outputs the NOR result; a first inverter which inverts an output of the first NOR gate and outputs the inverting result; and second inverters which buffer an output of the second NOR gate and output the inverting result.

In one embodiment, each of the plurality of driver input portions receives and NANDs an inverted sense amplification enable signal of a two-step later together with positive and negative signals of a (N+1)-th clocked sense amplifier through an input terminal of the NAND gate NAND to control an output signal to disable an output signal of the N-th clocked sense amplifier and all output signals prior to the output signal of the (N−1)-th clocked sense amplifier.

In another embodiment, each of the plurality of clocked sense amplifiers is configured in a latch form for not performing an operation when each of the plurality of sense amplification signals has a low level, and generating and outputting output signals of the power voltage level and the ground voltage level in a short time by repetitive self amplification while each of the plurality of sense amplification signals transitions to maintain a high level.

The sense amplification enable signal control portion can comprise: a plurality of delays which receive the initial sense amplification enable signal, sequentially delay the initial sense amplification enable signal by the plurality of predetermined time periods and output the delayed result; and an enable signal controller which receives the initial sense amplification enable signal and the plurality of delayed sense amplification enable signals, and outputs a short-time delayed sense amplification enable signal for a high speed semiconductor memory device and outputs a long-time delayed sense amplification enable signal for a semiconductor memory device of a high manufacturing yield.

The previous-step output driving circuit can comprise: first to eighth drivers in each of which a second PMOS transistor serially connected to a first PMOS transistor connected to the power voltage is serially connected to a second NMOS transistor serially connected to a first NMOS transistor connected to the ground voltage; a NAND gate which receives and NANDs an output signal of output terminals of the first to fourth drivers connected to each other and an output signal output of output terminals of the fifth to eighth drivers connected to each other, and which outputs the NAND result; and a NOR gate which receives and NORs the output signal output of output terminals of the first to fourth drivers connected to each other and the output signal of the output terminals of the fifth to eighth drivers connected to each other and output the NORing result.

The previous-step output driving circuit can operate such that positive and negative output signals of the plurality of clocked sense amplifiers are alternately input to gates of the PMOS transistors and gates of the NMOS transistors of the first to eighth drivers so that the negative output signal of the N-th clocked sense amplifier can intercept the positive output signal of the (N−1)-th clocked sense amplifier and the positive output signal of the N-th clocked sense amplifier can intercept the negative output signal of the (N−1)-th clocked sense amplifier.

In another aspect, a semiconductor memory device including a bit line sense amplifier for amplifying a voltage corresponding to a charge stored in a capacitor of a memory cell and outputting an amplified voltage at an output and an I/O sense amplifier for receiving the output of the bit line sense amplifier, amplifying a voltage level of the output and outputting an amplified voltage level, comprises: a sense amplification enable signal control portion which receives an initial sense amplification enable signal and delays the initial sense amplification enable signal by a plurality of predetermined time periods in response to control of a delay control signal and selectively outputs the initial sense amplification enable signal or the delayed sense amplification enable signal in response to operation speed varying request signal in view of both an operation speed and a manufacturing yield of a semiconductor memory device; a plurality of clocked sense amplifiers which each receive output signals of the I/O sense amplifier and amplify the output signals of the I/O sense amplifier in response to the delayed sense amplification enable signal to sequentially output an output signal of a power voltage level or a ground voltage level; and a previous-step output driving circuit which sequentially receives output signals of the plurality of clocked sense amplifiers, delays the output signals of the plurality of clocked sense amplifiers by a predetermined time period and outputs the delaying result, and then intercepts an output of a clocked sense amplifier of a previous step.

The semiconductor memory device can further comprise: a plurality of pre-charge portions which pre-charge both outputs of the plurality of clocked sense amplifiers to the power voltage level in a state that each of the plurality of sense amplification enable signals has a low level and drops one output of the both outputs to the ground voltage level when each of the plurality of sense amplification enable signals transitions to a high level; and an output driving circuit which receives an output signal of the previous-step output driving circuit, delays the output signal of the previous-step output driving circuit by a predetermined time period and outputs buffered read data.

The sense amplification enable signal control portion can comprise: a variable delay which receives the initial sense amplification enable signal, delays the initial sense amplification enable signal by a predetermined time period according to control of the delayed control signal and outputs the delayed result; and an enable signal controller which receives the initial sense amplification enable signal and the delayed sense amplification enable signal, and outputs the initial sense amplification enable signal for a high speed semiconductor memory device and outputs the delayed sense amplification enable signal for a semiconductor memory device of a high manufacturing yield when the operation speed varying request signal has a high level.

In one embodiment, the variable delay comprises: a first NAND gate for receiving and NANDing the initial sense amplification enable signal and the delay control signal and outputting the NAND result; a delay portion for receiving an output signal of the first NAND gate, delaying the output signal of the first NAND gate by a predetermined time period and outputting the delaying result; a second NAND gate for receiving and NANDing the initial sense amplification enable signal and an inverted delay control signal and outputting the NAND result; and a third NAND gate for receiving and NANDing an output signal of the second NAND gate and an output signal of the delay portion and outputting the NAND result.

In another embodiment, the delay control signal is a signal for controlling whether to delay the initial sense amplification enable signal by using a mode register setting signal or a fuse.

In another embodiment, the sense amplification enable signal control portion transitions a sense amplification enable signal of a corresponding step to a high level and a sense amplification enable signal of the other step to a low level when the operation speed varying request signal of the semiconductor memory device is applied with a high level in a state that the initial sense amplification enable signal has a high level.

In another embodiment, the sense amplification enable signal control portion transitions the sense amplification enable signal of the other step to a low level to disable a clocked sense amplifier of a previous step, thereby intercepting an output of the clocked sense amplifier of the previous step.

In another embodiment, the plurality of clocked sense amplifiers selectively output an output signal of the power voltage level and the ground voltage level for a low speed semiconductor memory device which is delayed in response to the plurality of sense amplification enable signals or an output signal of the power voltage level and the ground voltage level for a high speed semiconductor memory device which changes its operation speed to an operation speed requested by an operation speed varying request signal of the semiconductor memory device.

In another embodiment, each of the plurality of clocked sense amplifiers is configured in a latch form for not performing an operation when each of the plurality of sense amplification signals has a low level, and generating and outputting output signals of the power voltage level and the ground voltage level in a short time by repetitive self amplification while each of the plurality of sense amplification signals transitions to maintain a high level.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 9 is a timing diagram illustrating an operation of the previous-step output driving circuit of FIG. 8.

DETAILED DESCRIPTION OF THE INVENTION

Figure 1:
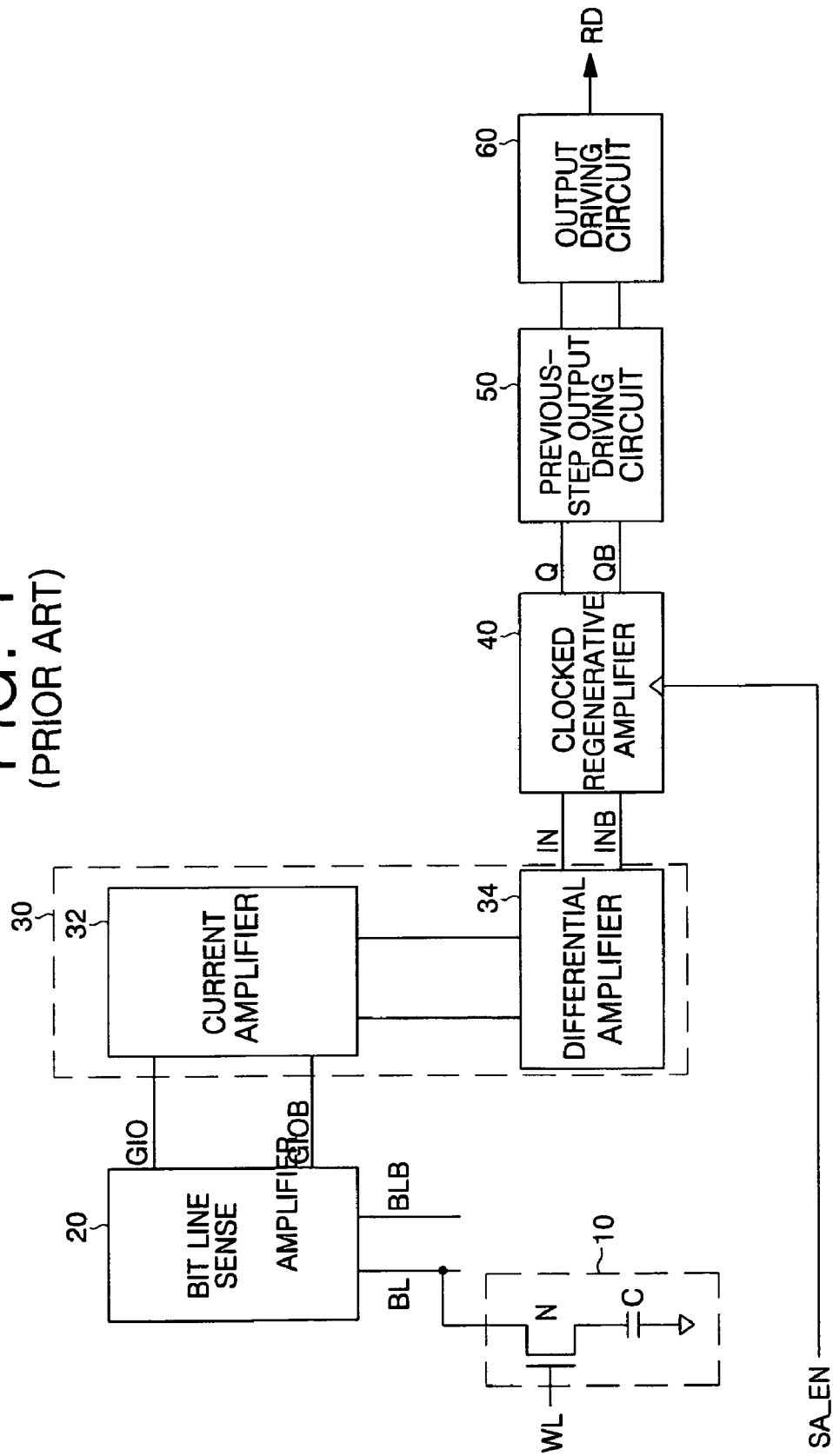
FIG. 1 is a block diagram illustrating a data output path of a semiconductor memory device having a clocked regenerative amplifier according to a conventional art.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
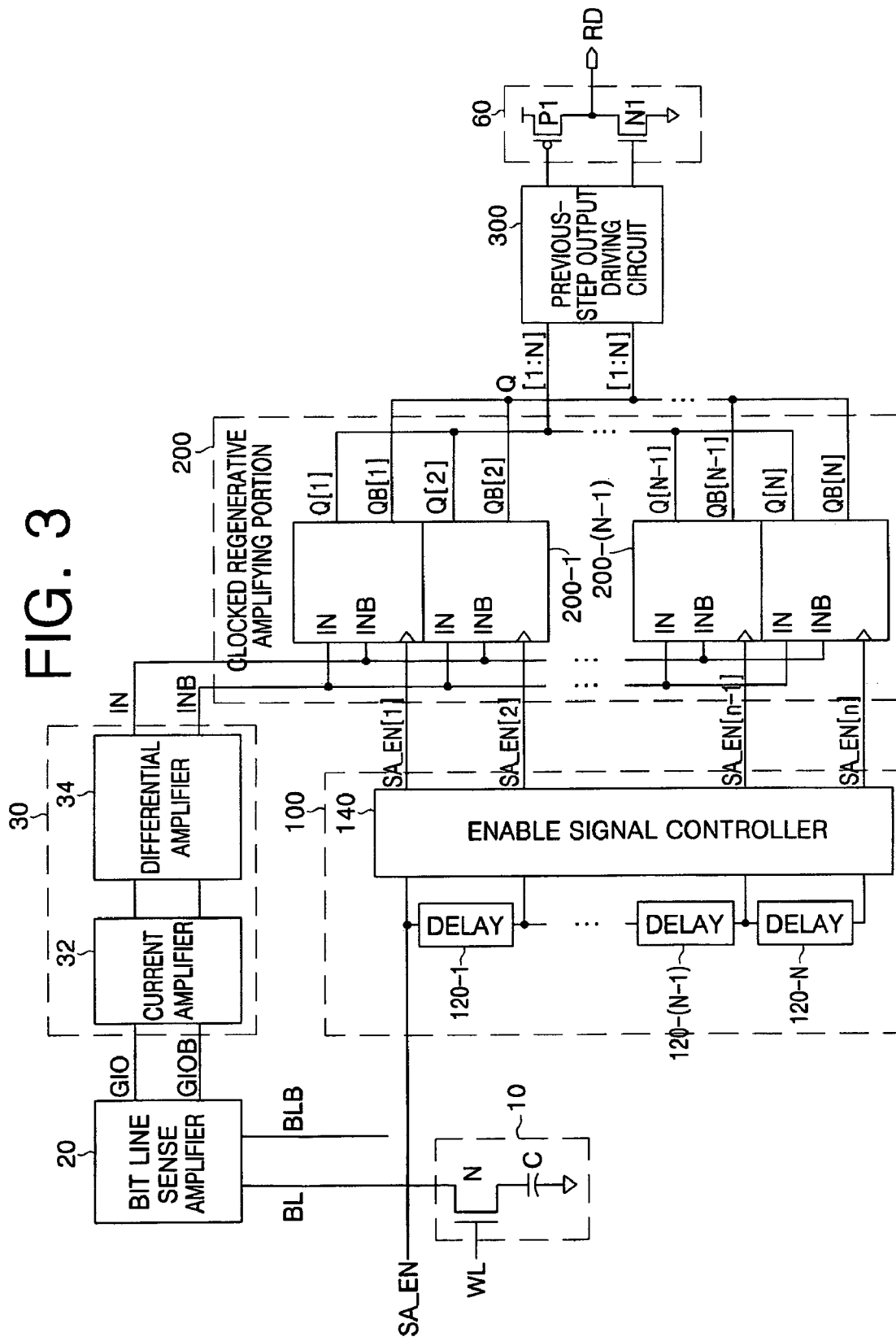
FIG. 3 is a schematic block diagram illustrating a data output path of a semiconductor memory device having a clocked regenerative amplifier according to an exemplary embodiment of the present invention.

FIG. 3 is a schematic block diagram illustrating a data output path of a semiconductor memory device having a clocked regenerative amplifier according to an exemplary embodiment of the present invention. The semiconductor memory device of FIG. 3 comprises a memory cell 10, a bit line sense amplifier 20, an I/O sense amplifier 30, a sense amplification enable signal control portion 100, a clocked regenerative amplifying portion 200, a previous-step output driving circuit 300, and an output driving circuit 60. The sense amplification enable signal, control portion 100 comprises a plurality of delays 120-1 to 120-N and an enable signal controller 140. The clocked regenerative amplifying portion 200 comprises a plurality of clocked regenerative amplifiers 200-1 to 200-N, and the I/O sense amplifier 30 comprises a current amplifier 32 and a differential amplifier 34.

Functions of the components of the data output path of the semiconductor memory device of FIG. 3 are described below.

The memory cell 10, the bit line sense amplifier 30, the I/O sense amplifier 30, and the output driving circuit 60 are substantially identical in operation to those of FIG. 1, and thus a description of those components is omitted.

The sense amplification enable signal control portion 100 receives an initial sense amplification enable signal SA_EN, sequentially delays it by a predetermined time through a plurality of delays 120-1 to 120-N, and outputs a plurality of delayed sense amplification enable signals SAEN[1] to SA_EN[N] having a relatively constant time margin in light of a manufacturing yield of a semiconductor memory device through the enable signal controller 140.

A plurality of clocked regenerative amplifiers 200-1 to 200-N commonly receive output signals IN and INB which do not have a power voltage level or a ground voltage level from the I/O sense amplifier 30 and respectively receive a plurality of delayed sense amplification enable signals SAEN[1] to SA_EN[N], so that they selectively output output signals Q[1] to Q[N] and QB[1] to QB[N] of a power voltage level and a ground voltage level in response to the control of the corresponding sense amplification signals SA_EN.

The previous-step output driving circuit 300 sequentially receives a plurality of positive signals and negative signals Q[1] to Q[N] and QB[1] to QB[N] and delays them by a predetermined time period before outputting them through the data line.

Figure 4:
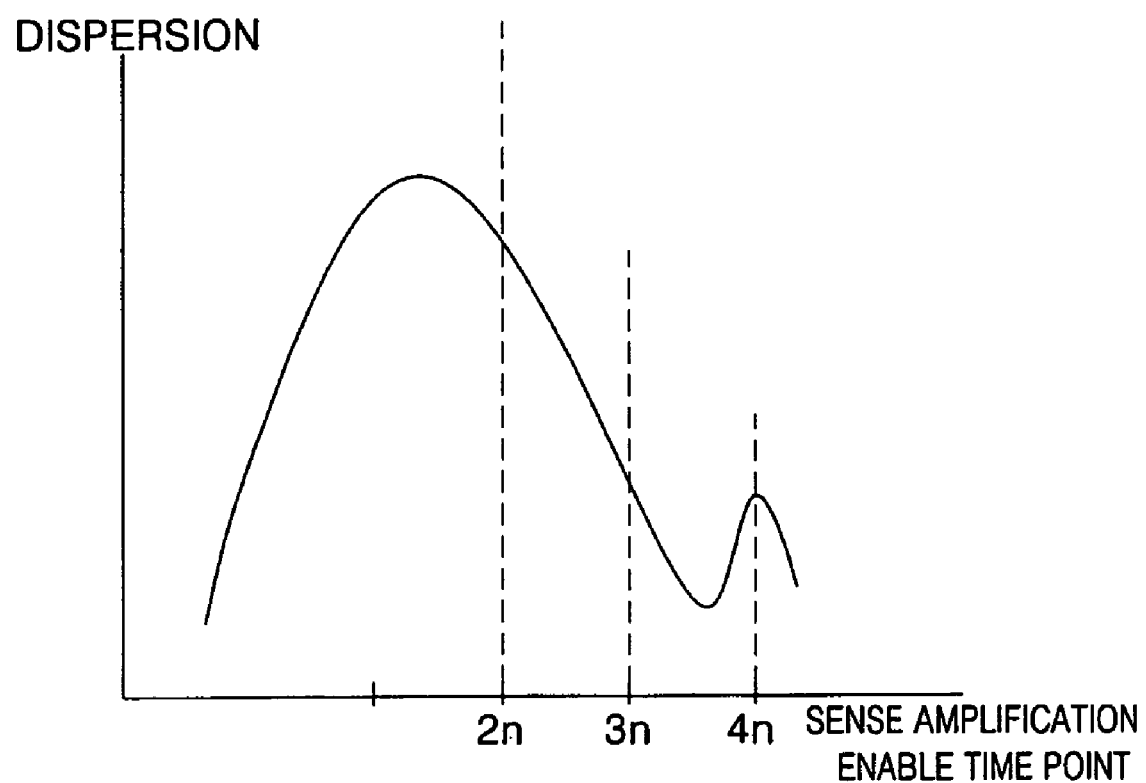
FIG. 4 is a dispersion graph illustrating a relationship between a sense amplification enable signal generating time point and a manufacturing yield in the semiconductor memory device according to the present invention.

FIG. 4 is a dispersion graph illustrating a relationship between a sense amplification enable signal generating time point and a manufacturing yield in a semiconductor memory device according to embodiments of the present invention. In FIG. 4, the horizontal axis denotes the generation time points of a plurality of delayed sense amplification enable signals SAEN[1] to SA_EN[N], the vertical axis denotes dispersion of semiconductor memory devices manufactured, and the area below the dispersion curve denotes the manufacturing yield.

Figure 2:
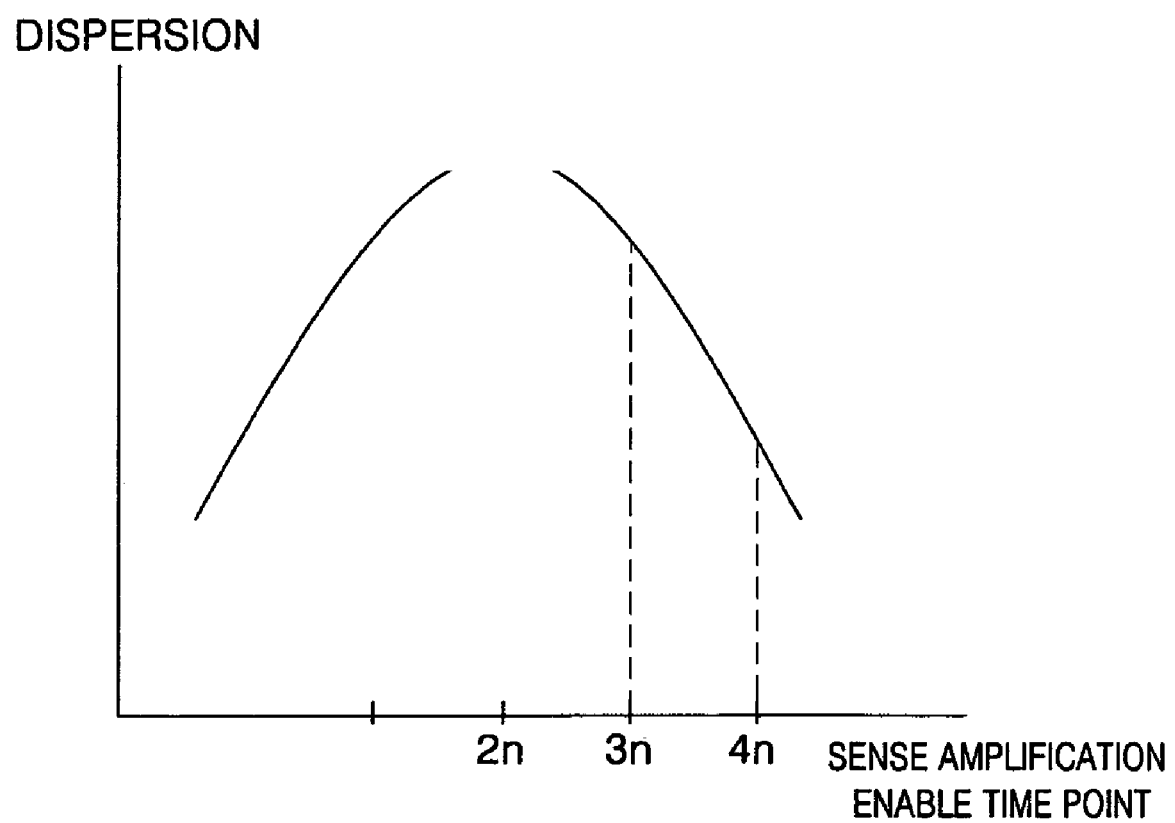
FIG. 2 is a dispersion graph illustrating a relationship between a sense amplification enable signal generating time point and a manufacturing yield in the conventional semiconductor memory device.

Similarly to FIG. 2, let us assume that one million dies are produced from a semiconductor wafer. If the generation time point of the sense amplification enable signal SA_EN[1] is 3 ns, a low speed semiconductor memory device in which dies of 80% are determined to be passed as good quality maintains a manufacturing yield of 90% by maintaining the generation time point of the sense amplification enable signal SA_EN [N] to 4 ns, similarly to the conventional art, and a high speed semiconductor memory device which is determined to be passed as good quality even when the generation time point of the sense amplification enable signal is 3 ns maintains a high operation speed by separately outputting input data without delaying the generation time point of the sense amplification enable signal to 4 ns in order to maintain a manufacturing yield.

As described above, according to the embodiments of the present invention, it is possible to manufacture the semiconductor memory device having an improved operation speed characteristic while maintaining manufacturing yield at an appropriate level.

An operation of the data output path of the semiconductor memory device according to the exemplary embodiments of the present invention having the clocked regenerative amplifier is described below with reference to FIGS. 3 and 4.

The word line enable operation of the memory cell 10, the operation of the bit line sense amplifier 20 for receiving charge stored in the capacitor C of the memory cell 10 and firstly amplifying a voltage, the secondly amplifying operation of the current amplifier of the I/O sense amplifier 30, and the thirdly amplifying operation of the differential amplifier 34 are substantially identical to those in the data output path of the conventional semiconductor memory device of FIG. 1, and thus detailed description thereof is omitted.

The sense amplification enable signal control portion 100 receives the initial sense amplification enable signal SA_EN of 3 ns in light of the manufacturing yield and sequentially delays it through a plurality of delays 120-1 to 120-N, each of which delays it by 0.2 ns, whereby it is delayed by 4 ns (SA_EN[N]) by the last delay.

The enable signal controller 140 receives a plurality of delayed sense amplification enable signals SA_EN[1] to SA_EN[N], and performs a control operation for having either the non-delayed initial sense amplification enable signal SA_EN or a plurality of sense amplification enable signals SA_EN[1] to SA_EN[3] which are delayed during a short time output in light of the high speed operation speed for the high speed semiconductor memory device and for having the N-th sense amplification enable signal SA_EN[N] whose generation time point is delayed to 4 ns output in light of a manufacturing yield for the low speed semiconductor memory device, as in FIG. 3.

A plurality of clocked regenerative amplifiers 200-1 to 200-N commonly receive the thirdly amplified output signals IN and INB from the I/O sense amplifier 30 through their input terminals, respectively, and individually receive a plurality of sense amplification enable signals SA_EN[1] to SA_EN[N] which are different in generation time point through their control terminals, respectively, so that the positive output signal Q[1] to Q[N] of the power voltage level and the negative output signals QB[1] to QB[N] of the ground voltage level are selectively output from the clocked regenerative amplifier when the sense amplification enable signal transitions to a high level.

The previous-step output driving circuit 300 sequentially receives a plurality of positive signals Q[1] to Q[N] and a plurality of negative signals QB[1] to QB[N] from a plurality of clocked regenerative amplifiers 200-1 to 200-N and delays them by a predetermined time period before outputting them, and the output driving circuit 60 receives the output signal from the previous-step output driving circuit 300, inverts its voltage level, and outputs the buffered read data to the data I/O pin (not shown).

For example, assume that five delays 120-1 to 120-5 are arranged in the sense amplification enable signal control portion 100 and each of the five delays are configured to delay by a time period of 0.2 ns and the positive input signal and the negative input signal are set as valid when a fifth sense amplification enable time point is 3.8 ns. The first to fourth clocked regenerative amplifiers 200-1 to 200-4 in which their sense amplification enable time point is 3.0 ns to 3.6 ns output invalid data, whereas the fourth clocked regenerative amplifiers 200-4 and 200-5 in which their sense amplification enable time points are 3.8 and 4.0 output valid data.

Therefore, the sense amplification enable period maintains a sufficient time margin until a stable input signal is guaranteed, leading to a sufficient manufacturing yield of 90%, and the fourth clocked regenerative amplifier 200-4 changes the sense amplification enable time point that valid data are output to 3.8 ns, and thus it is possible to manufacture the high speed semiconductor memory device which can transmit valid data 0.2 ns faster relative to the fourth clocked regenerative amplifier 200-5 whose sense amplification enable time point is 4 ns.

Figure 5:
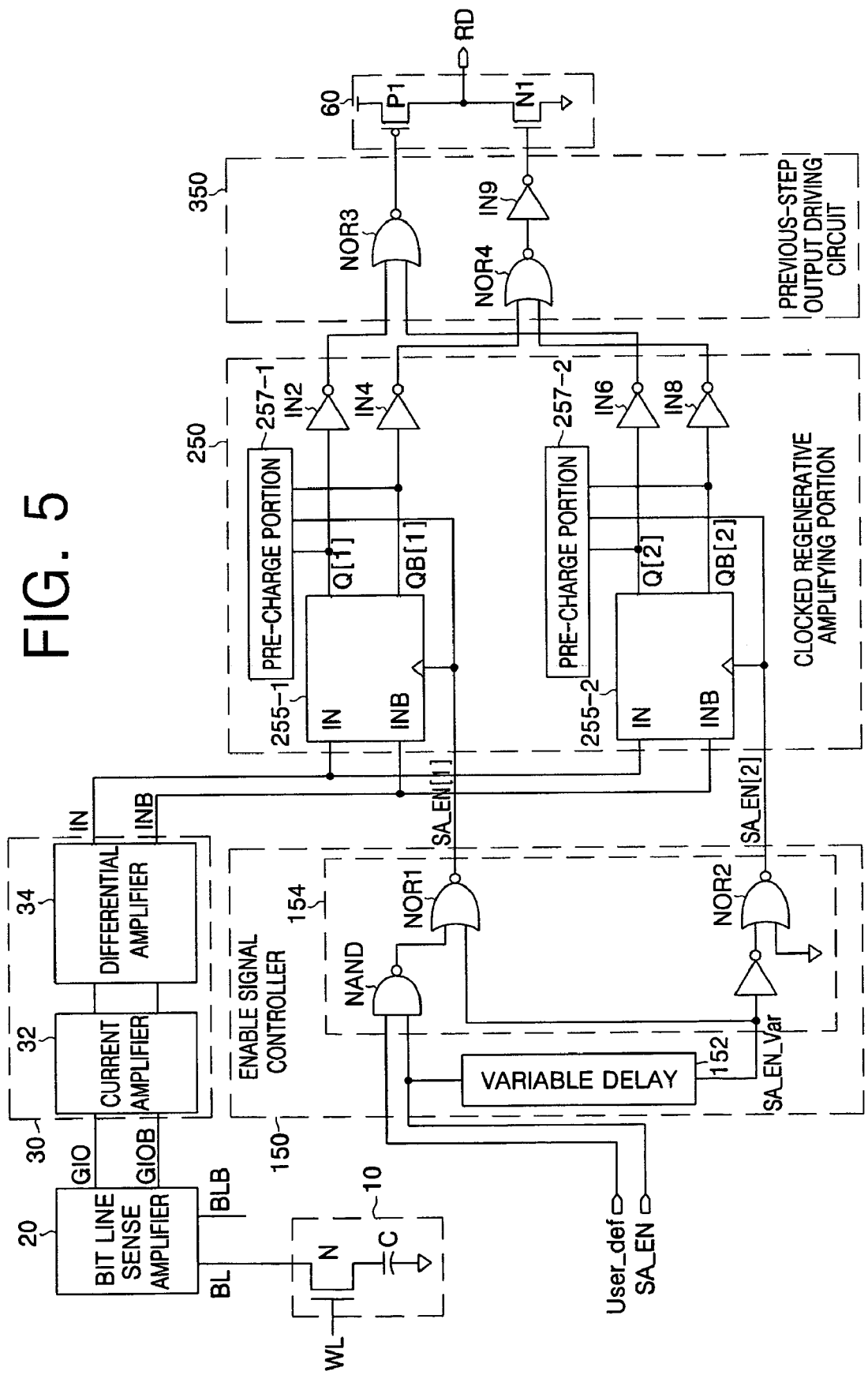
FIG. 5 is a block diagram illustrating a data output path of a semiconductor memory device having a clocked regenerative amplifier according to a first exemplary embodiment of the present invention.

FIG. 5 is a block diagram illustrating a data output path of a semiconductor memory device having a clocked regenerative amplifier according to a first exemplary embodiment of the present invention. The semiconductor memory device of FIG. 5 comprises a memory cell 10, a bit line sense amplifier 20, an I/O sense amplifier 30, a sense amplification enable signal control portion 150, a clocked regenerative amplifying portion 250, a previous-step output driving circuit 350, and an output driving circuit 60. The sense amplification enable signal control portion 150 comprises a variable delay 152 and an enable signal controller 154. The clocked regenerative amplifying portion 250 comprises two clocked regenerative amplifiers 255-1 and 255-2, two pre-charge portion 257-1 and 257-2, and fourth inverters IN2, IN4, IN6, and IN8. The I/O sense amplifier 30 comprises a current amplifier 32 and a differential amplifier 34.

Functions of the components of the data output path of the semiconductor memory device of FIG. 5 are described below.

The memory cell 10, the bit line sense amplifier 20, the I/O sense amplifier 30, and the output driving circuit 60 are substantially identical in operation to those of FIG. 1, and thus description thereof is omitted.

When the sense amplification enable signal control portion 150 receives an initial sense amplification enable signal SA_EN and a user defined signal User_def, the variable delay 152 delays the initial sense amplification enable signal SA_EN by a predetermined time, and the enable signal controller 154 outputs the non-delayed sense amplification enable signal SA_EN[1] together with the delayed sense amplification enable signal SA_EN[2] having a constant time margin in light of an operation speed varying request of a user through the user defined signal User_def of the semiconductor memory device.

The two clocked regenerative amplifiers 255-1 and 255-2 both receive the output signals IN and INB which do not have a power voltage level or a ground voltage level from the I/O sense amplifier 30, the clocked regenerative amplifier 255-1 outputs the output signals Q[1] and QB[1] of a power voltage level and a ground voltage level for the high speed semiconductor memory device whose operation speed is changed to an operation speed requested by the user according to control of the non-delayed sense amplification signals SA_EN[1], and the clocked regenerative amplifier 255-2 outputs the output signals Q[2] and QB[2] of a power voltage level and a ground voltage level for the low speed semiconductor memory device according to control of the delayed sense amplification signals SA_EN[2].

The two pre-charge portions 257-1 and 257-2 pre-charge both output terminals of the two clocked regenerative amplifiers 255-1 and 255-2 to a power voltage level before the sense amplification enable signals SA_EN[1] and SA_EN[2] are respectively applied to the control terminals of the two clocked regenerative amplifiers 255-1 and 255-2, and drop one of the outputs of the two clocked regenerative amplifiers 255-1 and 255-2 to a ground voltage level when one of the sense amplification enable signals SA_EN[1] and SA_EN[2] is applied with a high level.

The previous-step output driving circuit 350, in this example, comprises two NOR gates NOR3 and NOR4 and an inverter IN9, and it simultaneously receives two positive signals and two negative signals Q[1] and Q[2] and QB[1] and QB[2] from the two clocked regenerative amplifiers 255-1 and 255-2, performs an internal logic operation, and delays the operation result by a predetermined time before outputting it.

Figure 6:
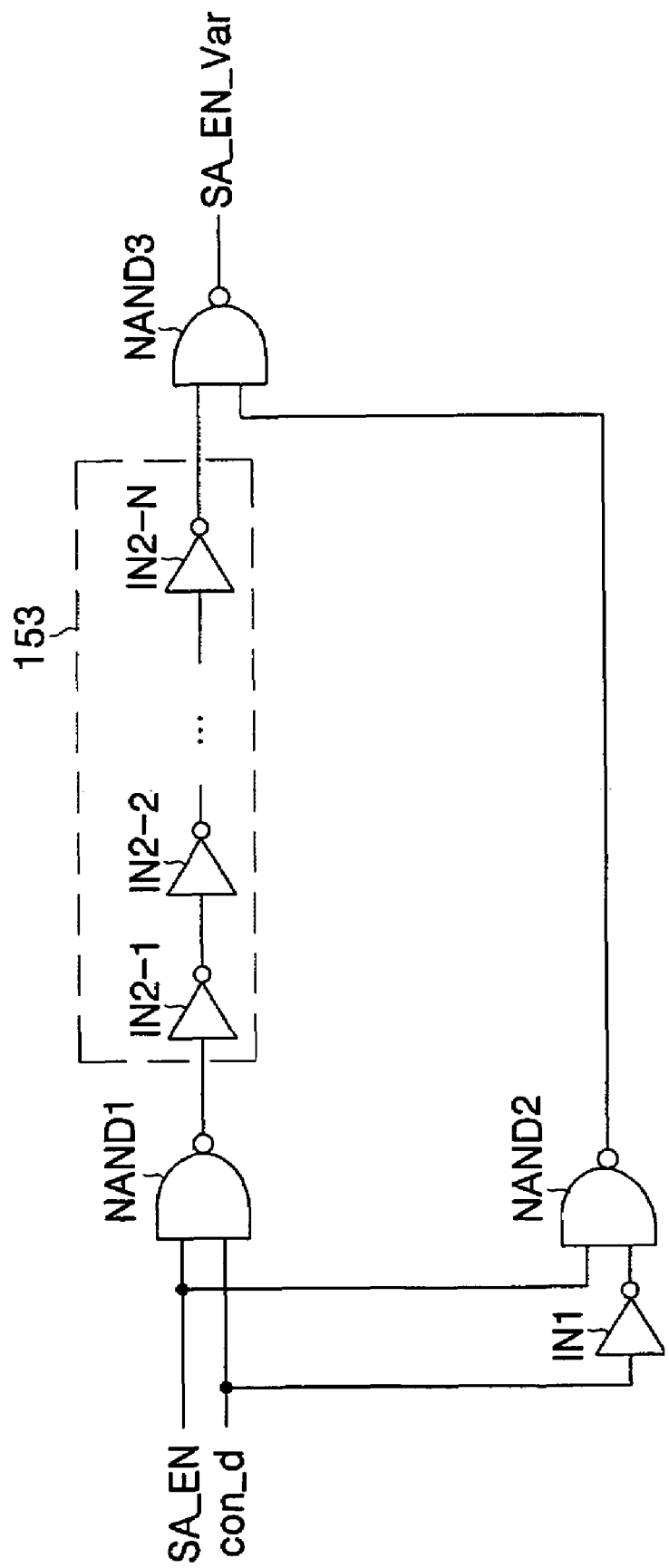
FIG. 6 is a circuit diagram illustrating a variable delay of the semiconductor memory device of FIG. 5.

FIG. 6 is a circuit diagram illustrating the variable delay circuit 152 of the semiconductor memory device of FIG. 5. The variable delay 152 of FIG. 6 comprises three NAND gates NAND1 to NAND3, an inverter IN1 and a delay portion 153. The delay portion 153 comprises even-number inverters IN2-1 to IN2-N, where N is an even number.

The first NAND gate NAND1 receives the initial sense amplification enable signal SA_EN and a delay control signal con_d, performs a NAND operation on them and outputs the NAND result, and the delay portion 153 receives an output of the first NAND gate NAND1 and delays it by a predetermined time before outputting it.

The delay control signal con_d is a signal for controlling whether to delay the initial sense amplification enable signal SA_EN by using a mode register setting signal MRS or by manipulating a fuse. When the delay control signal con_d has a high level, the initial sense amplification enable signal SA_EN is delayed, whereas when the delay control signal con_d has a low level, the initial sense amplification enable signal SA_EN is not delayed.

The second NAND gate NAND2 receives the initial sense amplification enable signal SA_EN and the inverted delay control signal, performs a NAND operation on them and outputs the NAND result, and the third NAND gate NAND3 receives an output signal of the second NAND gate NAND2 and the output signal of the delay portion 153, performs a NAND operation on them and outputs the NAND result.

An operation of the variable delay of FIG. 6 is described below in detail.

In a case where the initial sense amplification enable signal SA_EN does not need to be delayed, if the mode register setting signal MRS or the fuse is used to apply the delay control signal con_d of a low level, the first NAND gate NAND1 performs an NAND operation to unconditionally output a high level output signal and applies it to the delay portion 153, and the second NAND gate NAND2 receives the initial sense amplification enable signal SA_EN and performs a NAND operation to output the inverted sense amplification enable signal.

The third NAND gate NAND3 receives the high level output signal of the delay portion 153 and the inverted initial sense amplification enable signal SA_EN and performs a NAND operation on them to output the non-delayed sense amplification enable signal SA_EN.

In a case where the initial sense amplification enable signal. SA_EN needs to be delayed, if the mode register setting signal MRS, or the fuse is used to apply the delay control signal con_d of a high level, the first NAND gate NAND1 receives the initial sense amplification enable signal SA_EN and performs a NAND operation to output the inverted initial sense amplification enable signal SA_EN, and the delay portion 153 receives the inverted initial sense amplification enable signal SA_EN and delays it by a predetermined time through the even-number IN2-1 to IN2-N while maintaining the inverted phase.

The second NAND gate NAND2 receives an inverted signal of the delay control signal con_d with a high level and performs a NAND operation to output a high level output signal unconditionally. The third NAND gate NAND3 receives the high level output signal of the second NAND gate NAND2 and the inverted initial sense amplification enable signal SA_EN and performs a NAND operation to output the predetermined time-delayed initial sense amplification enable signal SA_EN_var.

An operation of the data output path of the semiconductor memory device having the clocked regenerative amplifier is described below with reference to FIGS. 5 and 6.

For straightforward description, in FIG. 5, assume that a user requests an operation speed of the semiconductor memory device to vary so that it operates at a 0.5 ns faster operation speed.

If the initial sense amplification enable signal SA_EN is applied with a low level, the first and second sense amplification enable signals SA_EN[1] and SA_EN[2] which have a low level are applied to the control terminals of the first and second clocked regenerative amplifiers 255-1 and 255-2, so that the two clocked regenerative amplifiers 255-1 and 255-2 do not operate and the two pre-charge portions 257-1 and 257-2 pre-charge the output terminals of the two clocked regenerative amplifiers 255-1 and 255-2 to a power voltage level.

Thereafter, if the initial sense amplification enables signal SA_EN transitions to a high level due to the commencement of the data read operation, the variable delay 152 of the sense amplification enable signal control portion 150 receives the signal and delays it by 0.5 ns before outputting it, and the enable signal controller 154 maintains the first sense amplification enable signal SA_EN[1] to a low level and transitions the second sense amplification enable signal SA_EN[2] to a high level before outputting it since the user defined signal User_def still has a low level.

The first clocked regenerative amplifier 255-1 receives the first sense amplification enable signal SA_EN[1] of a low level through its control terminal and so does not operate, but the second clocked regenerative amplifier 255-2 receives the output signals IN and INB of the I/O sense amplifier 30 which are thirdly amplified and output and is enabled by receiving the second sense amplification enable signal SA_EN[2] of a high level through its control terminal to thereby amplify and output the positive and negative output signals Q[2] and QB[2] of a ground voltage level and a power voltage level by help of an operation of the pre-charge portion 257-2.

Meanwhile, if a user determines that the operation speed of the semiconductor memory device needs to be improved in a state where the initial sense amplification enable signal SA_EN already transitions to a high level due to the commencement of the data read operation, so that the user defined signal User_def of a high level is applied by using, for example, a fuse, the non-delayed first sense amplification enable signal SA_EN[1] transitioned to a high level and the delayed second sense amplification enable signal SA_EN[2] transitioned to a low level are output.

Thus, the second clocked regenerative amplifier 255-2 receives the second amplification enable signal SA_EN[2] of a low level through its control terminal and so is disabled to stop its operation, and the first clocked regenerative amplifier 255-1 receives the output signals IN and INB of the I/O sense amplifier 30 which are thirdly amplified and output and is enabled by receiving the second sense amplification enable signal SA_EN[1] of a high level through its control terminal to thereby amplify and output the positive and negative output signals Q[1] and QB[1] of a ground voltage level and a power voltage level, not delayed by 0.5 ns, by help of an operation of the pre-charge portion 257-1.

The previous-step output driving circuit 350 simultaneously receives the first and second positive signals Q[1] and Q[2] and the first and second negative signals QB[1] and QB[2] from the first and second clocked regenerative amplifiers 255-1 and 255-2, performs a NOR operation on the first and second positive signals Q[1] and Q[2] through the NOR gate NOR3 and perform an OR operation on the first and second negative signals QB[1] and QB[2] through the NOR gate NOR4 and the inverter IN9, and outputs the operation output.

The output driving circuit 60 receives the NOR result of the previous-step output driving circuit 350 through a gate of a PMOS transistor P1 and the OR result of the previous-step output driving circuit 350 through a gate of a NMOR transistor N1 and outputs the read data RD buffered by inverting a voltage level to the data I/O pin.

Figure 7:
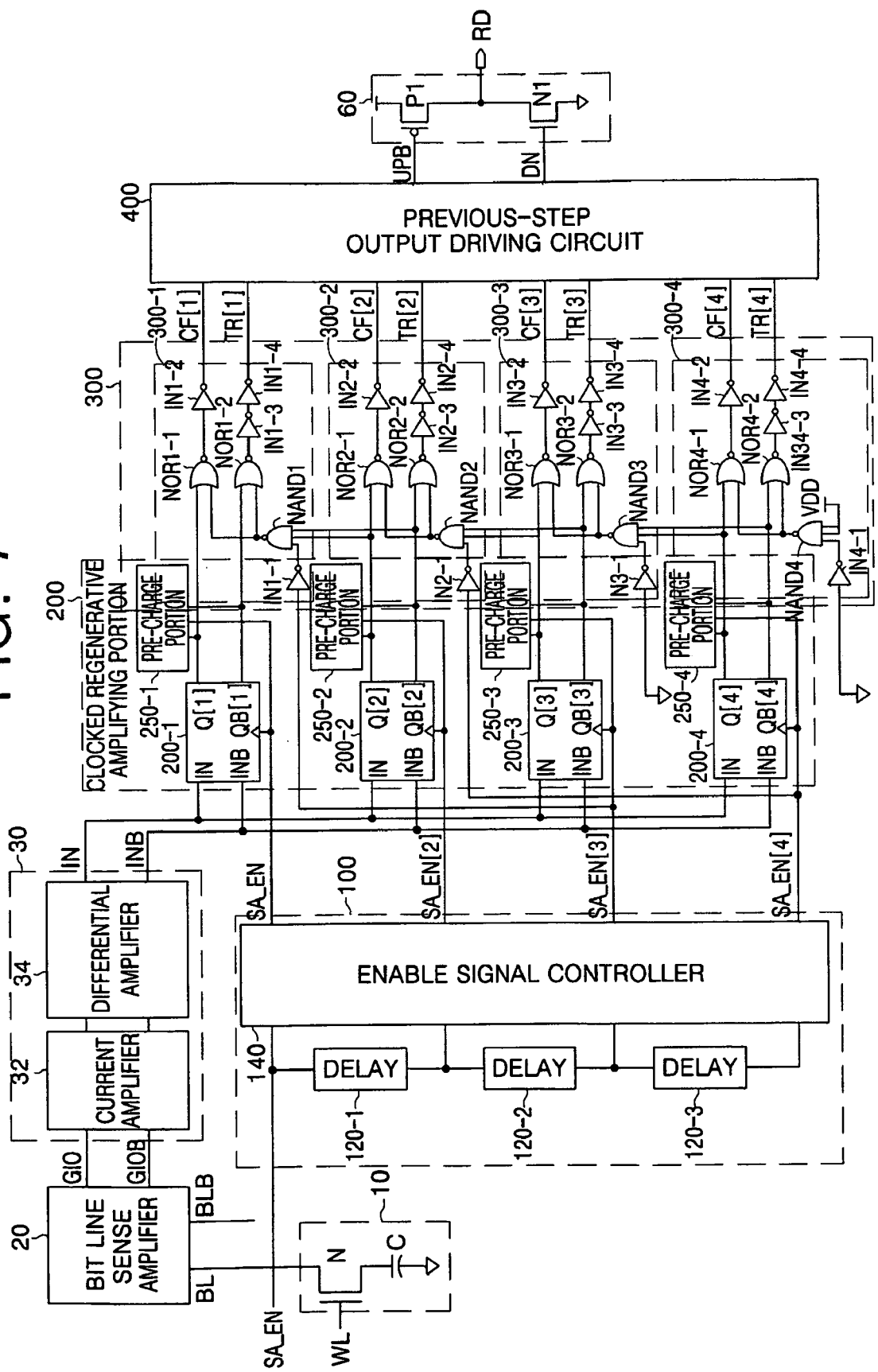
FIG. 7 is a block diagram illustrating a data output path of a semiconductor memory device having a clocked regenerative amplifier according to a second exemplary embodiment of the present invention.

FIG. 7 is a block diagram illustrating a data output path of a semiconductor memory device having a clocked regenerative amplifier according to a second exemplary embodiment of the present invention. The semiconductor memory device of FIG. 7 comprises a memory cell 10, a bit line sense amplifier 20, an I/O sense amplifier 30, a sense amplification enable signal control portion 100, a clocked regenerative amplifying portion 200, a driver input portion 300, a previous-step output driving circuit 400, and an output driving circuit 60. The I/O sense amplifier 30 comprises a current amplifier 32 and a differential amplifier 34. The sense amplification enable signal control portion 100 comprises a plurality of delays 120-1 to 120-3 and an enable signal controller 140. The clocked regenerative amplifying portion 200 comprises a plurality of clocked regenerative amplifiers 200-1 to 200-4 and a plurality of pre-charge portions 250-1 to 250-4.

Functions of the components of the data output path of the semiconductor memory device of FIG. 7 are described below.

The memory cell 10, the bit line sense amplifier 20, the I/O sense amplifier 30, the sense amplification enable signal control portion 100, and the output driving circuit 60 are substantially identical in operation to those of FIG. 5, and thus description thereof is omitted.

The sense amplification enable signal control portion 100 receives the initial sense amplification enable signal SA_EN, sequentially delays it by a predetermined time through a plurality of delays 120-1 to 120-3, and outputs a plurality of delayed sense amplification enable signals SA_EN[1] to SA_EN[4] having a constant time margin in light of an operation speed characteristic and a manufacturing yield of a semiconductor memory device through the enable signal controller 140.

A plurality of clocked regenerative amplifiers 200-1 to 200-4 each receive the output signals IN and INB which do not have a power voltage level or a ground voltage level from the I/O sense amplifier 30 and respectively receive a plurality of delayed sense amplification enable signals SAEN[1] to SA_EN[4], so that they selectively output the output signals Q[1] to Q[4] and QB[1] to QB[4] of a power voltage level and a ground voltage level according to control of the corresponding sense amplification signals.

A plurality of pre-charge portions 250-1 to 250-4 pre-charge both output terminals of a plurality of clocked regenerative amplifiers 200-1 to 200-4 to a power voltage level before the sense amplification enable signals SA_EN[1] to SA_EN[4] are respectively applied to the control terminals of a plurality of clocked regenerative amplifiers 200-1 to 200-4, and drop one of the both output terminals of each of a plurality of clocked regenerative amplifiers 200-1 to 200-4 to a ground voltage level when the sense amplification enable signals SA_EN[1] to SA_EN[4] are applied at a high level.

The driver input portion 300 receives a plurality of sense amplification enable signals SA_EN [3] and SA_EN[4], a ground voltage signal, and the positive output signals Q[1] to Q[4] and the negative output signals QB[1] to QB[4] of a plurality of clocked regenerative amplifiers 200-1 to 200-4, outputs data of the corresponding clocked regenerative amplifiers and then disables an output of data of the clocked regenerative amplifiers of the two prior steps.

The previous-step output driving circuit 400 should simultaneously receive a plurality of positive signals Q[1] to Q[4] and a plurality of negative signals QB[1] to QB[4] from a plurality of clocked regenerative amplifiers 200-1 to 200-4, perform an internal operation, and delay the operation result by a predetermined time before outputting it. However, unlike the semiconductor memory device according to the first exemplary embodiment of the present invention, the previous-step output driving circuit 400 has a different logic configuration of a NAND gate and a NOR gate in order to minimize a short-circuit current of the output driving circuit.

Figure 8:
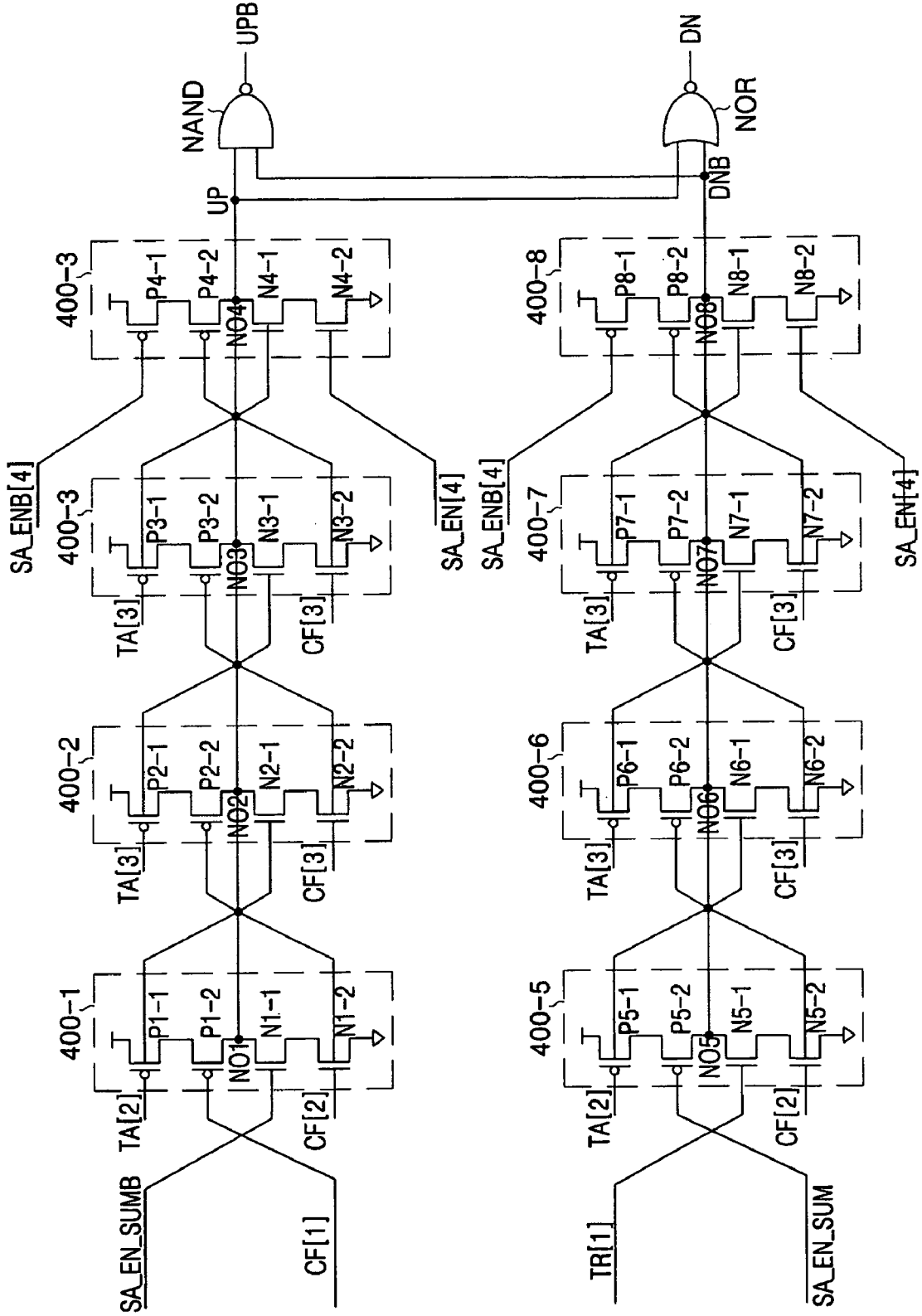
FIG. 8 is a circuit diagram illustrating a previous-step output driving circuit of the data output path of the semiconductor memory device of FIG. 7.

FIG. 8 is a circuit diagram illustrating the previous-step output driving circuit 400 of the data output path of the semiconductor memory device of FIG. 7. The previous-step output driving circuit of FIG. 8 comprises eight-step drivers 400-1 to 400-8, a NAND gate NAND, and a NOR gate NOR. In each of the 8-step drivers, a second PMOS transistor (P1-1 to P8-2) is serially connected to a first PMOS transistor (P1-1 to P8-1) connected to a power voltage, a first NMOS transistor (N1-1 to N8-2) is serially connected to a second NMOS transistor (N1-2 to N8-2) connected to a ground voltage, and the second PMOS transistor is serially connected to the first NMOS transistor.

In the driver input portion 300, second to fourth positive output signals TR[2] to TR[4] are respectively applied to gates of the first PMOS transistors P1-1 to P3-1 of the first to third drivers 400-1 to 400-3, gates of the first NMOS transistors N2-1 to N4-1 of the second to fourth drivers 400-2 to 400-4, and gates of the first PMOS transistors P5-1 to P8-1 of the fifth to eighth drivers 400-5 to 400-8, and first to fourth positive output signals TR[1] to TR[4] are respectively applied to gates of the first NMOS transistors N5-1 to N8-1 of the fifth to eighth drivers 400-5 to 400-8.

Also, in the driver input portion 300, first to fourth negative output signals CF[1] to CF[4] are respectively applied to gates of the second PMOS transistors P1-2 to P4-2 of the first to fourth drivers 400-1 to 400-4, second to fourth negative output signals CF[2] to CF[4] are respectively applied to gates of the second NMOS transistors N1-2 to N3-2 of the first to third drivers 400-1 to 400-3, gates of the second NMOS transistors N5-2 to N7-2 of the fifth to seventh drivers 400-5 to 400-7, and gates of the second PMOS transistors P6-2 to P8-2 of the sixth to eighth drivers 400-6 to 400-8.

Meanwhile, an inverted signal SA_EN_SUMB of a pulse width sum signal of a plurality of sense amplification enable signals SA_EN[1] to SA_EN[4] is applied to the gate of the first NMOS transistor N1-1 of the first driver 400-1, and a pulse width sum signal SA_EN_SUM of a plurality of sense amplification enable signals SA_EN[1] to SA_EN[4] is applied to the gate of the second PMOS transistor P5-2 of the fifth driver 400-5.

The signal SA_EN_SUM is a signal in which all pulse widths of the first to fourth sense amplification enable signals SA_EN[i] to SA_EN[4] are added to extend an enable period and is used to perform a control operation for respectively applying a power voltage and a ground voltage to the gate of the PMOS transistor P1 and the gate of the NMOS transistor N1 of the output driving circuit 60 to thereby prevent the output driving circuit 60 from being driven.

The inverted fourth sense amplification enable signal SA_ENB[4] is respectively applied to the gate of the first PMOS transistor P4-1 of the fourth driver 400-4 and the gate of the first PMOS transistor P8-1 of the eighth driver 400-8, and the fourth sense amplification enable signal SA_EN[4] is respectively applied to the second NMOS transistor N4-2 of the fourth driver 400-4 and the gate of the second NMOS transistor N8-2 of the eighth driver 400-8.

The NAND gate NAND and the NOR gate NOR receives an output signal UP output since output terminals NO1 to NO4 of the first to fourth drivers 400-1 to 400-4 are connected to each other and an output signal DNB output since output terminals NO5 to NO8 of the fifth to eighth drivers 400-5 to 400-8 are connected to each other, perform a NAND operation and a NOR operation and output the operation results, respectively.

FIG. 9 is a timing diagram illustrating an operation of the previous-step output driving circuit 400 of FIG. 8. FIG. 9 illustrates the pulse width sum signal SA_EN_SUM, a plurality of sense amplification enable signals SA_EN[1] to SA_EN[4], the first to fourth positive and negative output signals TR[1] to TR[4] and CF[1] to CF[4] of the driver input portion 300, the output signal up of the first to fourth drivers 400-1 to 400-4, the output signal DNB of the fifth to eighth drivers 400-5 to 400-8, the output signals UPB and DN of the previous-step output driving circuit 400, and the output signal RD of the output driving circuit 60.

An operation of the previous-step driving circuit of FIG. 8 is described below with reference to FIGS. 8 and 9.

If the sense amplification enable signals SA_EN[1] and SA_EN[2] sequentially transition from a low level to a high level, the first and second negative output signals CF[1] and CF[2] of the driver input portion 300 transition from a high level to a low level.

As the first and second negative output signals CF[1] and CF[2] of the driver input portion 300 transition to a low level, the output signal UP of the first and second drivers 400-1 and 400-2 transitions from a low level to a high level or maintains a high level, and as the second negative signal CF[2] transitions to a low level, the output signal DNB of the sixth driver 400-6 maintains a high level. Thus, the NAND gate NAND outputs a signal of a low level, and the PMOS transistor P1 of the output driving circuit 60 is turned on, whereby the output signal RD transitions to a high level.

If the sense amplification enable signals SA_EN[3] and SA_EN[4] sequentially transition from a low level to a high level, the third and fourth positive output signals TR[3] and TR[4] of the driver input portion 300 transition from a low level to a high level, and the first and second negative output signals CF[1] and CF[2] transition to a high level again, whereby a collision of data is prevented.

As the third and fourth positive output signals TR[3] and TR[4] transitions to a high level, the output signal DNB of the seventh and eighth drivers 400-7 and 400-8 transitions from a high level to a low level or maintain a low level, and as the third positive signal TR[3] transitions to a high level, the output signal UP transitions to a low level again.

As both the output signals DNB and UP transition to a low level, the NOR gate NOR outputs a signal of a high level, and the NMOS transistor N1 of the output driving circuit 60 is turned on, whereby the output signal RD transitions to a low level again.

Thereafter, if the sense amplification enable signals SA_EN[1] and SA_EN[2] transition to a low level again, the pulse width sum signal SA_EN_SUM transitions to a low level again, and the output signal DNB of the fifth driver 400-5 transitions to a high level again in a state that the second positive output signal TR[2] has a low level.

As described above, the previous-step output driving circuit 400 operates such that the negative output signal of the N-th clocked regenerative amplifier intercepts the positive output signal of the (N−1)-th clocked regenerative amplifier which is a previous step and the positive output signal of the N-th clocked regenerative amplifier intercepts the negative output signal of the (N−1)-th clocked regenerative amplifier which is a previous step.

An operation of the data output path of the semiconductor memory device having the clocked regenerative amplifier according to the second exemplary embodiment of the present invention is described below with reference to FIGS. 7 to 9.

For the sake of straightforward description, it is assumed that the initial sense amplification enable signal SA_EN which is enabled at 3 ns is sequentially delayed by the three delays 120-1 to 120-3, each of which delays it by a time period of 0.2 ns, whereby it is delayed by 3.6 ns by the last delay, and a user requests an operation speed of the semiconductor memory device to vary so that it operates at a 0.5 ns faster operation speed.

The word line enable operation of the memory cell 10, the operation of the bit line sense amplifier 20 for receiving charge stored in the capacitor C of the memory cell 10 and firstly amplifying a voltage, the secondly amplifying operation of the current amplifier 32 of the I/O sense amplifier 30, and the thirdly amplifying operation of the differential amplifier 34 are substantially identical to those in the data output path of the semiconductor memory device according to the first exemplary embodiment of the present invention, and thus detailed description thereof is omitted.

If a user requests an operation speed of the semiconductor memory device to vary so that it operates at a 0.5 ns faster operation speed, the operations for selectively operating a plurality of clocked regenerative amplifiers 200-1 to 200-4 and adjusting a sense amplification enable interval by manipulating the user defined signal User_def to delay the sense amplification enable signal by 0.5 ns by and controlling a plurality of sense amplification enable signals SA_EN[1] to SA_EN[4] is substantially identical to those of the semiconductor memory device having the clocked regenerative amplifier of FIG. 5 according to the first exemplary embodiment of the present invention, and thus detailed description thereof is omitted.

The sense amplification enable signal control portion 100 receives the initial sense amplification enable signal SA_EN which is enabled at 3 ns and delays it through the three delays 120-1 to 120-3 each of which delays it by 0.2 ns to thereby output the second to fourth sense amplification enable signals SA_EN[2] to SA_EN[4] which are enabled at 3.2 ns, 3.4 ns and 3.6 ns together with the non-delayed sense amplification enable signal SA_EN[1] in light of the manufacturing yield.

Thus, since the first sense amplification enable signal SA_EN[1] maintains a low level before 3 ns, the second to fourth sense amplification enable signals SA_EN[2] to SA_EN[4] and the pulse width sum signal SA_EN_SUM of a plurality of sense amplification enable signals are not generated, thereby continuously maintaining a low level.

A plurality of clocked regenerative amplifiers 200-1 to 200-3 commonly receive the thirdly amplified output signals IN and INB from the I/O sense amplifier 30 through their input terminals and individually receive a plurality of sense amplification enable signals SA_EN[1] to SA_EN[4] which are different in enable time points through their control terminals, and only the clocked regenerative amplifiers in which the sense amplification enable signal transitions to a high level are enabled to amplify and output the positive and negative output signals Q[1] to Q[4] and QB[1] to QB[4] of a ground voltage level and a power voltage level by help of an operation of the pre-charge portions 250-1 to 250-4.

For example, if the positive and negative input signal Q[3] and QB[3] are set as valid at 3.4 ns which is a thirdly sense amplification enabled time point, the first and second clocked regenerative amplifiers 200-1 and 200-2 that the sense amplification enabled time points are 3.0 ns and 3.2 ns output invalid data, and the third and fourth clocked regenerative amplifiers 200-3 and 200-4 that the sense amplification enabled time points are 3.4 ns and 3.6 ns output valid data.

In the first driver input portion 300-1, the NAND gate NAND1 receives the inverted third sense amplification enable signal SA_ENB[3] and the positive and negative output signals Q[2] and QB[2] of the second clocked regenerative amplifier 200-2 through its input terminal, performs a NAND operation on them and outputs the NAND result, the first NOR gate NOR1-1 receives the output signal of the NAND gate NAND1 and the negative output signal QB[1] of the first clocked regenerative amplifier 200-1, performs a NOR operation on them and outputs the NOR result through the inverter IN1-2, and the second NOR gate NOR1-2 receives the output signal of the NAND gate NAND1 and the positive output signal Q[1] of the first clocked regenerative amplifier 200-1, performs a NOR operation on them and outputs the NOR result through the two inverters IN1-3 and IN1-4.

In the second driver input portion 300-2, the NAND gate NAND2 receives the inverted fourth sense amplification enable signal SA_ENB[4] and the positive and negative output signals Q[3] and QB[3] of the third clocked regenerative amplifier 200-3 through its input terminal, performs a NAND operation on them and outputs the NAND result, the first NOR gate NOR2-1 receives the output signal of the NAND gate NAND2 and the negative output signal QB[2] of the second clocked regenerative amplifier 200-2, performs a NOR operation on them and outputs the NOR result through the inverter IN2-2, and the second NOR gate NOR2-2 receives the output signal of the NAND gate NAND2 and the positive output signal Q[2] of the second clocked regenerative amplifier 200-2, performs a NOR operation on them and outputs the NORing result through the two inverters IN2-3 and IN2-4.

In the third driver input portion 300-3, the NAND gate NAND3 receives the inverted ground voltage signal and the positive and negative output signals Q[4] and QB[4] of the fourth clocked regenerative amplifier 200-4 through its input terminal, performs a NAND operation on them and outputs the NAND result, the first NOR gate NOR3-1 receives the output signal of the NAND gate NAND3 and the negative output signal QB[3] of the third clocked regenerative amplifier 200-3, performs a NOR operation on them and outputs the NOR result through the inverter IN3-2, and the second NOR gate NOR3-2 receives the output signal of the NAND gate NAND3 and the positive output signal Q[3] of the third clocked regenerative amplifier 200-3, performs a NOR operation on them and outputs the NOR result through the two inverters IN3-3 and IN3-4.

In the fourth driver input portion 300-3, the NAND gate NAND4 outputs a low level since three inputs of a high level are applied to its input terminal, the first NOR gate NOR4-1 receives the output signal of the NAND gate NAND4 and the negative output signal QB[4] of the fourth clocked regenerative amplifier 200-4, performs a NOR operation on them and outputs the NOR result through the inverter IN4-2, and the second NOR gate NOR4-2 receives the output signal of the NAND gate NAND4 and the positive output signal Q[4] of the fourth clocked regenerative amplifier 200-4, performs a NOR operation on them and outputs the NOR result through the two inverters IN4-3 and IN4-4.

Since the second to fourth sense amplification enable signals SA_EN[2] to SA_EN[4] are not generated before the initial sense amplification enable signal SA_EN transitions to a high level and so the positive signals Q[1] to Q[4] and the negative output signals QB[1] to QB[4] of a plurality of clocked regenerative amplifiers 200-1 to 200-4 maintain a ground voltage level and a power voltage level, the previous-step output driving circuit 400 simultaneously receives these signals to prevent the output driving circuit 60 from being driven.

Thereafter, when the initial sense amplification enable signal SA_EN transitions to a high level, the pulse width sum signal SA_EN_SUM of a plurality of sense amplification enable signals SA_EN[1] to SA_EN[4] transitions to a high level, and levels of the outputs of the driver input portion 300 vary, so that the previous-step output driving circuit 400 outputs the signals for driving the output driving circuit 60.

However, it is necessary to intercept the outputs of the previous-step clocked regenerative amplifiers so that a plurality of clocked regenerative amplifiers 200-1 to 200-4 sequentially operate due to sequential enable operations of a plurality of sense amplification enable signals SA_EN[1] to SA_EN[4] to amplify the positive and negative output signals Q[1] to Q[4] and QB[1] to QB[4] of a ground voltage level and a power voltage level and transfer them to the output driving circuit 60.

That is, in the previous-step output driving circuit 400, the positive and negative output signals of a plurality of clocked regenerative amplifiers 200-1 to 200-4 are alternately input to the gate of the PMOS transistor and the gate of the NMOS transistor of each driver so that the negative output signal of the N-th clocked regenerative amplifier can intercept the positive output signal of the (N−1)-th clocked regenerative amplifier and the positive output signal of the N-th clocked regenerative amplifier can intercept the negative output signal of the (N−1)-th clocked regenerative amplifier.

In order to disable all signals prior to the output signal of the (N−1)-th clocked regenerative amplifier, the N-th driver input portion receives the inverted (N+2)-th sense amplification enable signal together with the positive and negative signals of the (N+1)-th clocked regenerative amplifier through the input terminal of the NAND gate NAND, performs a NAND operation on them and outputs the NAND result to control the output signal of the N-th driver input portion.

For example, if it is assumed that valid data are output from the third clocked regenerative amplifier 200-3, the first and second clocked regenerative amplifiers 200-1 and 200-2 output invalid data. Since the previous-step output driving circuit 400 can disable the output signal of the second clocked regenerative amplifier 200-2 which is an one-step previous amplifier but can not intercept the output of the first clocked regenerative amplifier 200-1 which is a two-step previous amplifier, invalid data output from the first clocked regenerative amplifier 200-1 may collide with valid data output from the third clocked regenerative amplifier 200-3.

At this time, since the third sense amplification enable signal SA_EN[3] is inverted, transitions to a low level and then is applied to the input terminal of the NAND gate NAND1 of the first driver input portion 300-1, the NAND result unconditionally has a high level, and so the first and second NOR gates NOR1-1 and NOR1-2 are applied to the first driver input portion, thereby intercepting the output signal of the first clocked regenerative amplifier 200-1.

This approach is different from a method for transitioning the sense amplification enable signal of the previous step to a low level to disable the clocked regenerative amplifier of the previous step to thereby intercept the output of the clocked regenerative amplifiers of the previous step as in the first exemplary embodiment of the present invention that two clocked regenerative amplifiers are used. The second exemplary embodiment of the preset invention is particularly applicable in cases where a time point that the output signal of the N-th clocked regenerative amplifier which is valid data when there are three or more clocked regenerative amplifiers is disabled is difficult to be in front of a time point that the output signal of the (N−1)-th or less clocked regenerative amplifier is intercepted.

As described above, according to the exemplary embodiments of the present invention, a reverse-proportion relationship between the manufacturing yield and the operation speed characteristic is minimized, and thus it is possible to manufacture the semiconductor memory device with the appropriate manufacturing yield and the improved operation speed characteristic.

While the invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device including a bit line sense amplifier for amplifying a voltage corresponding to a charge stored in a capacitor of a memory cell and outputting an amplified voltage at an output and an I/O sense amplifier for receiving the output of the bit line sense amplifier, amplifying a voltage level of the output and outputting an amplified voltage level, comprising:
   a sense amplification enable signal control portion which receives an initial sense amplification enable signal, sequentially delays the initial sense amplification enable signal by a plurality of predetermined time periods and selectively outputs a plurality of delayed sense amplification enable signals in view of both an operation speed and a manufacturing yield of a semiconductor memory device;
   a plurality of clocked sense amplifiers which each receive an output signal of the I/O sense amplifier, amplify the output signal of the I/O sense amplifier in response to each of the plurality of delayed sense amplification enable signals, and sequentially output an output signal of a power voltage level or a ground voltage level in response; and
   a previous-step output driving circuit which sequentially receives the output signals of the plurality of clocked sense amplifiers, delays the output signals of the plurality of clocked sense amplifiers by a predetermined time period, and then intercepts an output of the clocked sense amplifier of a previous step.

2. The semiconductor memory device of claim 1, further comprising:
   a plurality of pre-charge portions which pre-charge both outputs of the plurality of clocked sense amplifiers to the power voltage level in a state that each of the plurality of sense amplification enable signals has a low level and drops one output of the both outputs to the ground voltage level when each of the plurality of sense amplification enable signals transitions to a high level;
   a plurality of driver input portions which receive the plurality of sense amplification enable signals, a ground voltage signal, and the output signals of the plurality of clocked sense amplifiers and output an output of a corresponding clocked sense amplifier before intercepting an output of a clocked sense amplifier of a two-step prior; and
   an output driving circuit which receives an output signal of the previous-step output driving circuit, delays the output signal of the previous-step output driving circuit by a predetermined time period and outputs buffered read data.

3. The semiconductor memory device of claim 2, wherein each of the plurality of driver input portions comprises:
   a NAND gate which receives and NANDs an inverted signal of a sense amplification enable signal of a two-step later or the ground voltage and output signals of a clocked sense amplifier of a one-step later through an input terminal thereof and outputs the NAND result;
   a first NOR gate which receives and NORs the output signal of the NAND gate and a negative output signal of a corresponding clocked sense amplifier and outputs the NOR result;
   a second NOR gate which receives and NORs the output signal of the NAND gate and a positive output signal of a corresponding clocked sense amplifier and outputs the NOR result;
   a first inverter which inverts an output of the first NOR gate and outputs the inverting result; and
   second inverters which buffer an output of the second NOR gate and output the inverting result.

4. The semiconductor memory device of claim 3, wherein each of the plurality of driver input portions receives and NANDs an inverted sense amplification enable signal of a two-step later together with positive and negative signals of a (N+1)-th clocked sense amplifier through an input terminal of the NAND gate NAND to control an output signal to disable an output signal of the N-th clocked sense amplifier and all output signals prior to the output signal of the (N−1)-th clocked sense amplifier.

5. The semiconductor memory device of claim 1, wherein each of the plurality of clocked sense amplifiers is configured in a latch form for not performing an operation when each of the plurality of sense amplification signals has a low level, and generating and outputting output signals of the power voltage level and the ground voltage level in a short time by repetitive self amplification while each of the plurality of sense amplification signals transitions to maintain a high level.

6. The semiconductor memory device of claim 1, wherein the sense amplification enable signal control portion comprises:
   a plurality of delays which receive the initial sense amplification enable signal, sequentially delay the initial sense amplification enable signal by the plurality of predetermined time periods and output the delayed result; and
   an enable signal controller which receives the initial sense amplification enable signal and the plurality of delayed sense amplification enable signals, and outputs a short-time delayed sense amplification enable signal for a high speed semiconductor memory device and outputs a long-time delayed sense amplification enable signal for a semiconductor memory device of a high manufacturing yield.

7. The semiconductor memory device of claim 1, wherein the previous-step output driving circuit comprises
   first to eighth drivers in each of which a second PMOS transistor serially connected to a first PMOS transistor connected to the power voltage is serially connected to a second NMOS transistor serially connected to a first NMOS transistor connected to the ground voltage;

a NAND gate which receives and NANDs an output signal of output terminals of the first to fourth drivers connected to each other and an output signal output of output terminals of the fifth to eighth drivers connected to each other, and which outputs the NAND result; and
a NOR gate which receives and NORs the output signal output of output terminals of the first to fourth drivers connected to each other and the output signal of the output terminals of the fifth to eighth drivers connected to each other and output the NORing result.

8. The semiconductor memory device of claim 7, wherein the previous-step output driving circuit operates such that positive and negative output signals of the plurality of clocked sense amplifiers are alternately input to gates of the PMOS transistors and gates of the NMOS transistors of the first to eighth drivers so that the negative output signal of the N-th clocked sense amplifier can intercept the positive output signal of the (N−1)-th clocked sense amplifier and the positive output signal of the N-th clocked sense amplifier can intercept the negative output signal of the (N−1)-th clocked sense amplifier.

9. A semiconductor memory device including a bit line sense amplifier for amplifying a voltage corresponding to a charge stored in a capacitor of a memory cell and outputting an amplified voltage at an output and an I/O sense amplifier for receiving the output of the bit line sense amplifier, amplifying a voltage level of the output and outputting an amplified voltage level, comprising:
a sense amplification enable signal control portion which receives an initial sense amplification enable signal and delays the initial sense amplification enable signal by a plurality of predetermined time periods in response to control of a delay control signal and selectively outputs the initial sense amplification enable signal or the delayed sense amplification enable signal in response to operation speed varying request signal in view of both an operation speed and a manufacturing yield of a semiconductor memory device;
a plurality of clocked sense amplifiers which each receive output signals of the I/O sense amplifier and amplify the output signals of the I/O sense amplifier in response to the delayed sense amplification enable signal to sequentially output an output signal of a power voltage level or a ground voltage level; and
a previous-step output driving circuit which sequentially receives output signals of the plurality of clocked sense amplifiers, delays the output signals of the plurality of clocked sense amplifiers by a predetermined time period and outputs the delaying result, and then intercepts an output of a clocked sense amplifier of a previous step.

10. The semiconductor memory device of claim 9, further comprising:
a plurality of pre-charge portions which pre-charge both outputs of the plurality of clocked sense amplifiers to the power voltage level in a state that each of the plurality of sense amplification enable signals has a low level and drops one output of the both outputs to the ground voltage level when each of the plurality of sense amplification enable signals transitions to a high level; and
an output driving circuit which receives an output signal of the previous-step output driving circuit, delays the output signal of the previous-step output driving circuit by a predetermined time period and outputs buffered read data.

11. The semiconductor memory device of claim 9, wherein the sense amplification enable signal control portion comprises:

a variable delay which receives the initial sense amplification enable signal, delays the initial sense amplification enable signal by a predetermined time period according to control of the delayed control signal and outputs the delayed result; and
an enable signal controller which receives the initial sense amplification enable signal and the delayed sense amplification enable signal, and outputs the initial sense amplification enable signal for a high speed semiconductor memory device and outputs the delayed sense amplification enable signal for a semiconductor memory device of a high manufacturing yield when the operation speed varying request signal has a high level.

12. The semiconductor memory device of claim 11, wherein the variable delay comprises:
a first NAND gate for receiving and NANDing the initial sense amplification enable signal and the delay control signal and outputting the NAND result;
a delay portion for receiving an output signal of the first NAND gate, delaying the output signal of the first NAND gate by a predetermined time period and outputting the delaying result;
a second NAND gate for receiving and NANDing the initial sense amplification enable signal and an inverted delay control signal and outputting the NAND result; and
a third NAND gate for receiving and NANDing an output signal of the second NAND gate and an output signal of the delay portion and outputting the NAND result.

13. The semiconductor memory device of claim 12, wherein the delay control signal is a signal for controlling whether to delay the initial sense amplification enable signal by using a mode register setting signal or a fuse.

14. The semiconductor memory device of claim 11, wherein the sense amplification enable signal control portion transitions a sense amplification enable signal of a corresponding step to a high level and a sense amplification enable signal of the other step to a low level when the operation speed varying request signal of the semiconductor memory device is applied with a high level in a state that the initial sense amplification enable signal has a high level.

15. The semiconductor memory device of claim 14, wherein the sense amplification enable signal control portion transitions the sense amplification enable signal of the other step to a low level to disable a clocked sense amplifier of a previous step, thereby intercepting an output of the clocked sense amplifier of the previous step.

16. The semiconductor memory device of claim 9, wherein the plurality of clocked sense amplifiers selectively output an output signal of the power voltage level and the ground voltage level for a low speed semiconductor memory device which is delayed in response to the plurality of sense amplification enable signals or an output signal of the power voltage level and the ground voltage level for a high speed semiconductor memory device which changes its operation speed to an operation speed requested by an operation speed varying request signal of the semiconductor memory device.

17. The semiconductor memory device of claim 16, wherein each of the plurality of clocked sense amplifiers is configured in a latch form for not performing an operation when each of the plurality of sense amplification signals has a low level, and generating and outputting output signals of the power voltage level and the ground voltage level in a short time by repetitive self amplification while each of the plurality of sense amplification signals transitions to maintain a high level.

* * * * *